(12) United States Patent
Kim

(10) Patent No.: US 7,445,462 B2
(45) Date of Patent: Nov. 4, 2008

(54) METHOD OF CONNECTING SIGNAL LINES, A PRINTED CIRCUIT BOARD ASSEMBLY AND ELECTRONIC APPARATUS HAVING THE SAME

(75) Inventor: Jae-young Kim, Suwon-si (KR)

(73) Assignee: Samsung Electronics Co., Ltd, Suwon-si (KR)

( * ) Notice: Subject to any disclaimer, the term of this patent is extended or adjusted under 35 U.S.C. 154(b) by 0 days.

(21) Appl. No.: 11/610,620

(22) Filed: Dec. 14, 2006

(65) Prior Publication Data

US 2007/0155193 A1 Jul. 5, 2007

(30) Foreign Application Priority Data

Jan. 3, 2006 (KR) .................. 10-2006-0000413

(51) Int. Cl.
*H01R 12/00* (2006.01)
*H05K 1/00* (2006.01)
(52) U.S. Cl. .......................... 439/67; 439/82
(58) Field of Classification Search .............. 439/67, 439/493, 82, 55, 81, 77
See application file for complete search history.

(56) References Cited

U.S. PATENT DOCUMENTS 4,231,154 A * 11/1980 Gazdik et al. ............... 29/840
4,950,173 A * 8/1990 Minemura et al. ........... 439/82

FOREIGN PATENT DOCUMENTS

| JP | 2002-270978 | 9/2000 |
| JP | 2002-270979 | 9/2002 |
| JP | 2004-146497 | 5/2004 |

* cited by examiner

*Primary Examiner*—Javaid Nasri
(74) *Attorney, Agent, or Firm*—Stanzione & Kim, LLP

(57) ABSTRACT

A method of connecting signal lines, a printed circuit board assembly and an electronic apparatus having the same. The present general inventive concept provides a printed circuit board assembly in which signal lines are connected between a first board and a second board, including a connector having a plurality of pins provided in one of the first board and the second board, and a connector coupling member having a plurality of pin housings which come in contact with the pins by being deformed in a pin coupling direction to electrically connect to the pins and which are provided in a surface of the other of the first board and the second board.

22 Claims, 6 Drawing Sheets

METHOD OF CONNECTING SIGNAL LINES, A PRINTED CIRCUIT BOARD ASSEMBLY AND ELECTRONIC APPARATUS HAVING THE SAME

CROSS-REFERENCE TO RELATED APPLICATIONS

This application claims priority under 35 U.S.C. 119 §(a) from Korean Patent Application No. 2006-0000413, filed on Jan. 3, 2006, in the Korean Intellectual Property Office, the disclosure of which is incorporated herein in their entireties by reference.

BACKGROUND OF THE INVENTION

1. Field of the Invention

The present general inventive concept relates to a method of connecting signal lines, a printed circuit board assembly and an electronic apparatus having the same, and more particularly, to a printed circuit board assembly and an electronic apparatus having the same which has an improved electrical connection structure.

2. Description of the Related Art

In general, a printed circuit board assembly includes a printed circuit board (PCB) used as a component of electronic apparatuses from home electronics such as a digital TV and a computer, to advanced communication appliances. The printed circuit board is provided with signal lines on a predetermined board body for electrically connecting electronic components, such as an integrated circuit, a resistor, and a connector on transmitting signals therebetween. Such a printed circuit board is made of a material having no flexibility such as epoxy resin and bake-lite, or a material having flexibility such as polyimide.

In such a printed circuit board, electronic components, such as a connector, are mounted in the board body, for example, by soldering, using a ball grid or a pin, or the like.

A connector structure for electrically connecting electronic components is illustrated in FIG. 1. The conventional connector structure includes a connector 113 which has a plurality of pins 111 connected to signal lines 119a provided on a first board 110a, and a pin coupling member 117 provided on a second board 110b and having pin housings 115 coupled to signal lines 119b and the pins 111. With this configuration, the connector 113 is coupled to the pin coupling member 117 to electrically connect to the pin coupling member 117.

Recently, decreasing the size and weight of electronic components has been increasing in popularity due to convenience of portability.

However, the conventional connector structure has a complicated structure because of the combination of the connector and the pin coupling member, and requires the process of coupling the connector and the pin coupling member to the boards. Accordingly, there is a problem that the conventional printed circuit board assembly requires many components and a large size and space thereof.

SUMMARY OF THE INVENTION

The present general inventive concept provides a method of connecting signal lines, a printed circuit board assembly, and an electronic apparatus having the same, with a relatively simple electrical connection structure.

Additional aspects and utilities of the present general inventive concept will be set forth in part in the description which follows and, in part, will be obvious from the description, or may be learned by practice of the general inventive concept.

The foregoing and/or other aspects and utilities of the present general inventive concept may be achieved by providing a printed circuit board assembly in which signal lines are connected between a first board and a second board, comprising a connector having a plurality of pins provided in one of the first board and the second board, and a connector coupling member having a plurality of pin housings which come in contact with the pins by being deformed in a pin coupling direction, to electrically connect to the pins and which are provided in a surface of the other of the first board and the second board.

Each pin housing may comprise a pin housing body, and a pin contact member provided on the pin housing body and being deformable to come in contact with the pin.

The pin contact member may comprise a conductive part provided to electrically connect to each signal line of the other of the first board and the second board.

An area of the conductive part, which comes in contact with the pin, may be exposed to electrically connect to outside the circuit board.

An inner side of the pin contact member may include a plurality of conductive parts to be spaced from each other and the plurality of conductive parts may be disposed radially.

The other of the first board and the second board, on which the connector coupling member is provided, may comprise a flexible printed circuit board (FPC).

The flexible printed circuit board may comprise polyimide. However, other materials that perform the intended operations of the present general inventive concept may be used alternatively.

The printed circuit board assembly may further comprise a reinforcing plate coupled to a surrounding area of each pin housing.

The reinforcing plate may comprise plastics. However, other materials that perform the intended operations of the present general inventive concept may be used alternatively.

The foregoing and/or other aspects and utilities of the present general inventive concept may also be achieved by providing an electronic apparatus comprising a printed circuit board assembly in which signal lines are connected between a first board and a second board, the printed circuit board comprising a connector having a plurality of pins provided in one of the first board and the second board, and a connector coupling member having a plurality of pin housings which come in contact with the pins by being deformed in a pin coupling direction to electrically connect to the pins and which are provided in a surface of the other of the first board and the second board.

Each pin housing may comprise a pin housing body, and a pin contact member provided on the pin housing body and being deformable to come in contact with the pin.

The pin contact member may comprise a conductive part provided to electrically connect to each signal line of the other of the first board and the second board.

An area of the conductive part, which comes in contact with the one of the plurality of pins, may be exposed to electrically connect to outside the circuit board.

An inner side of the pin contact member may include a plurality of conductive parts to be spaced from each other, and the plurality of conductive parts may be disposed radially.

The other of the first board and the second board, on which the connector coupling member is provided, may comprise a flexible printed circuit board (FPC).

The flexible printed circuit board may comprise polyimide. However, other materials that perform the intended operations of the present general inventive concept may be used alternatively.

According to another aspect of the present general inventive concept, the printed circuit board may further comprise a reinforcing plate coupled to a surrounding area of each pin housing.

The reinforcing plate may comprise plastics. However, other materials that perform the intended operations of the present general inventive concept may be used alternatively.

The foregoing and/or other aspects and utilities of the present general inventive concept may also be achieved by providing a printed circuit board assembly, comprising a pin coupled to a first signal line in a first board, a pin housing coupled to a second signal line in a second board; and a conductive part coupled to the pin housing to elastically and electrically connect the pin to the pin housing, wherein the conductive part is deformable to secure the pin thereto.

The conductive part may be deformed in a pin coupling direction.

The pin housing may deform with the conductive part.

The foregoing and/or other aspects and utilities of the present general inventive concept may also be achieved by providing a printed circuit board assembly, comprising a connector having a plurality of pins provided in one of a first board on a second board, and a plurality of deformable receiving units provided on a second board to securely receive a respective one of the plurality of pins by deforming in a pin receiving direction.

The deformable receiving units may comprise a pin housing body integral to the second board, and a pin deforming member coupled to a surface of the pin housing body.

The pin housing body and the pin deforming member may both deform to securely receive the pin.

The foregoing and/or other aspects and utilities of the present general inventive concept may also be achieved by providing a method of connecting signal lines between two boards, comprising, coupling a pin to a first signal line in a first board, coupling a pin to a second signal line in a second board, and deformably inserting the pin into the pin housing to electrically connect the pin to the pin housing.

The pin housing may deform while the pin is inserted thereinto.

The pin housing may comprise a pin contact member which is deformable to come in contact with the pin.

The pin contact member may be deformed in a pin coupling direction.

The pin contact member may comprise a conductive part to elastically connect the pin to the pin housing.

BRIEF DESCRIPTION OF THE DRAWINGS

These and/or other aspects and utilities of the present general inventive concept will become apparent and more readily appreciated from the following description of the embodiments, taken in conjunction with the accompanying drawings of which.

DETAILED DESCRIPTION OF THE PREFERRED EMBODIMENTS

Figure 1:
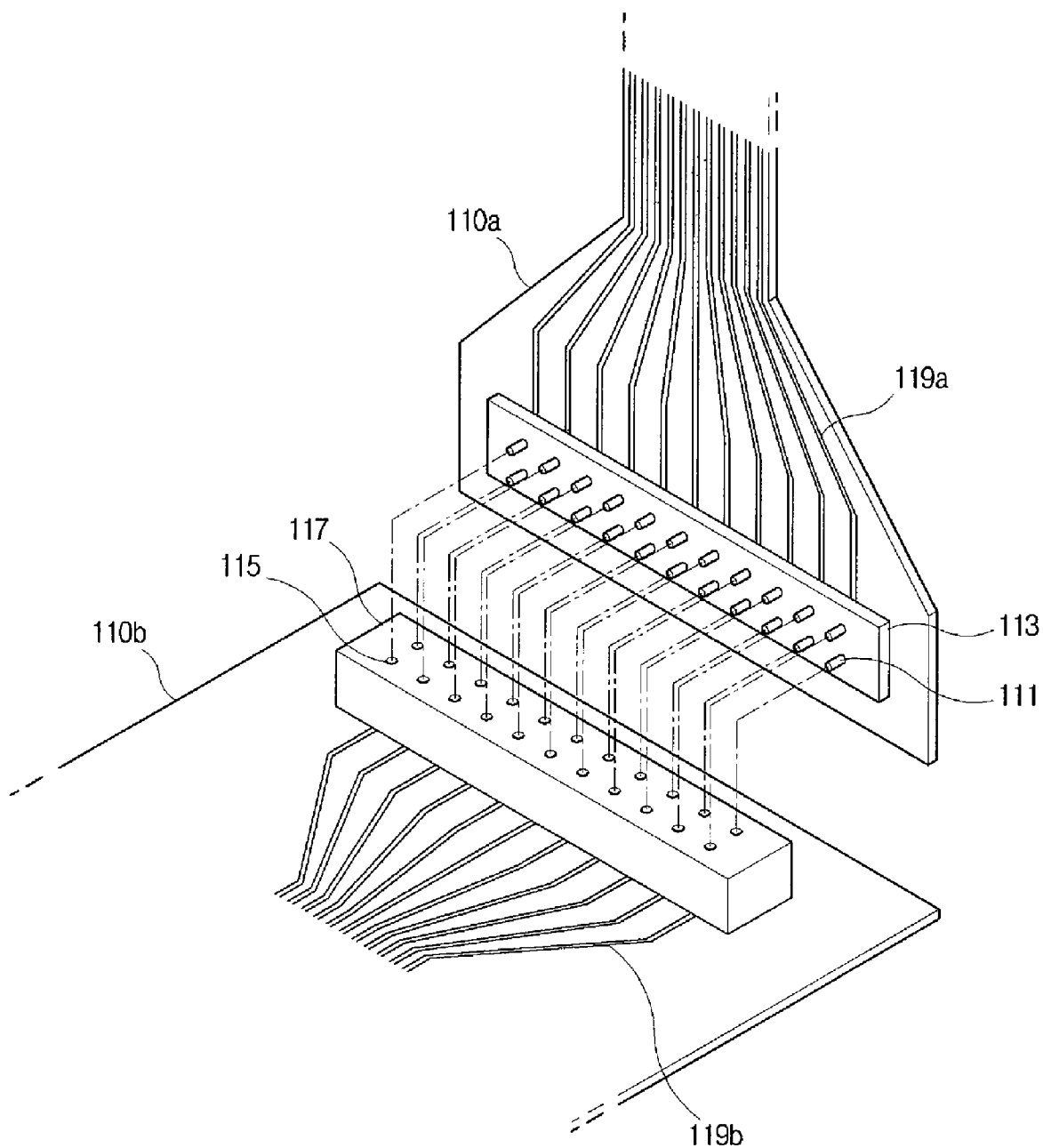
FIG. 1 is a perspective view illustrating a conventional printed circuit board assembly.

Reference will now be made in detail to the embodiments of the present general inventive concept, examples of which are illustrated in the accompanying drawings, wherein like reference numerals refer to the like elements throughout. The embodiments are described below in order to explain the present general inventive concept by referring to the figures.

Figure 2:
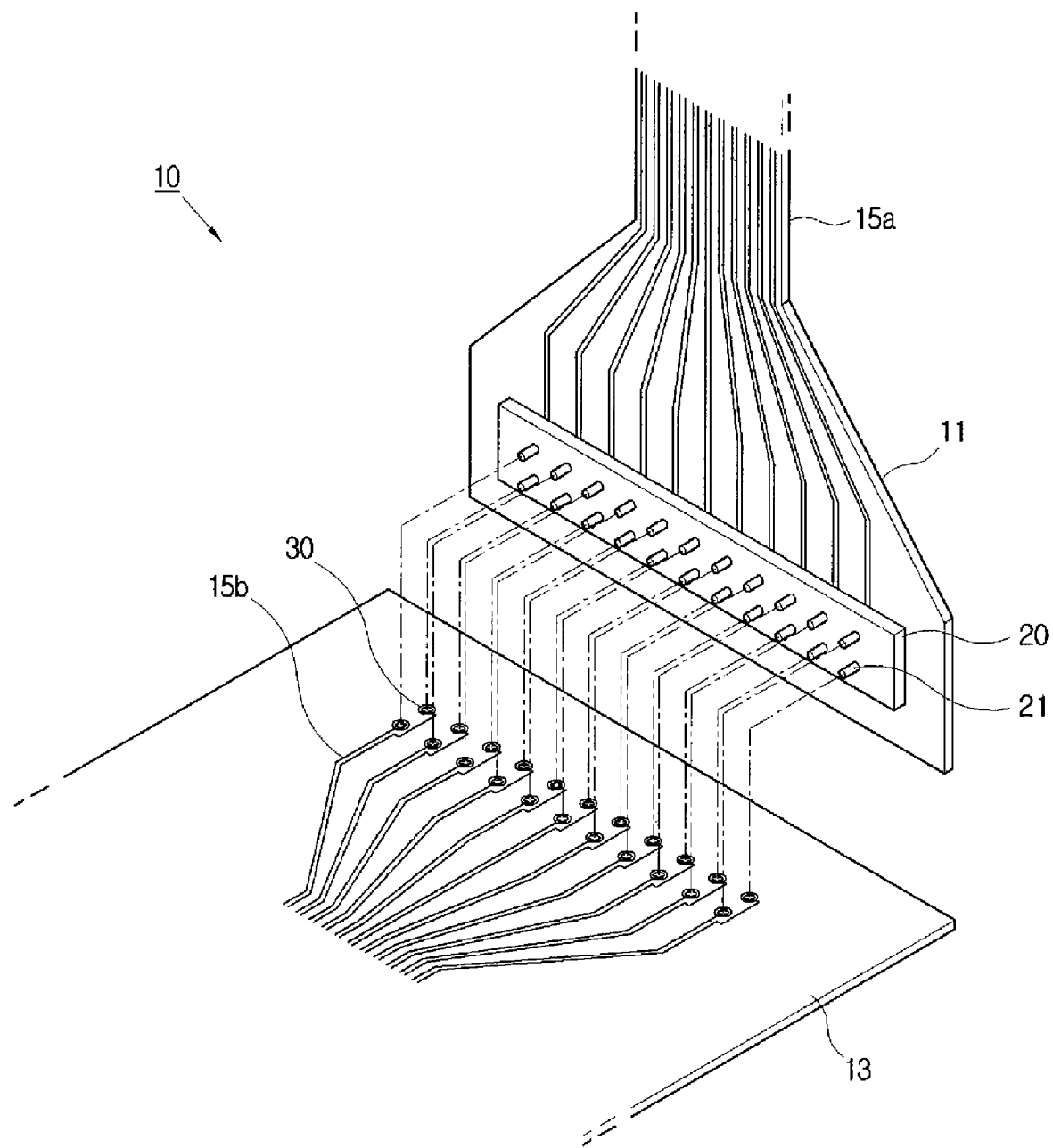
FIG. 2 is perspective view illustrating a printed circuit board assembly according to an embodiment of the present general inventive concept.
Figure 3:
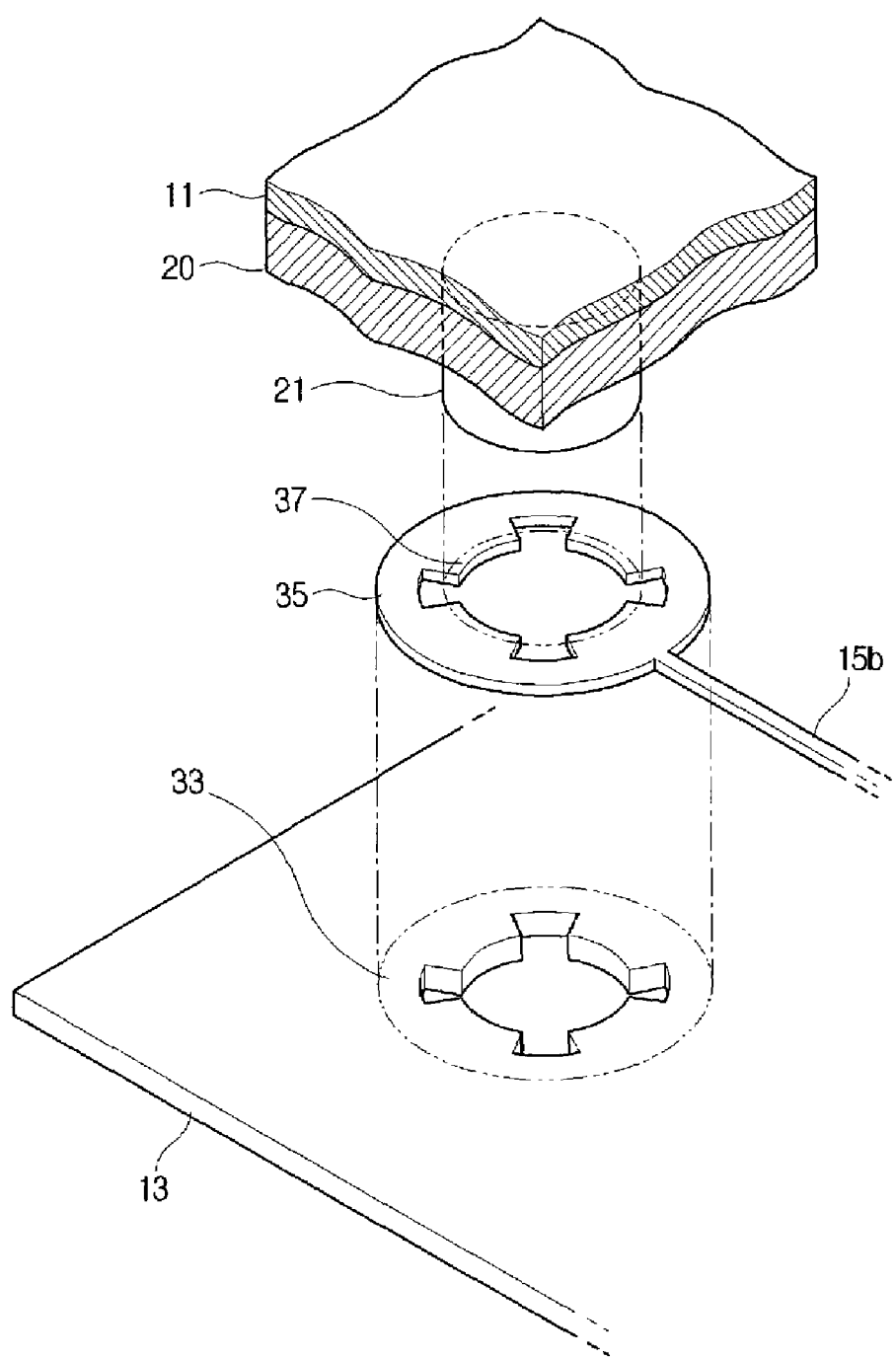
FIG. 3 is a partially enlarged plan view illustrating a connector pin according to the embodiment of FIG. 2.

As illustrated in FIGS. 2 and 3, a printed circuit board assembly 10 according to an embodiment of the present general inventive concept includes a first board 11 and a second board 13 each having signal lines 15a and 15b, a connector 20 provided on the first board 11 and having a plurality of pins 21, and a connector coupling member 30 provided in a surface of the second board 13 and having pin housings 31 which come in contact with the pins 21 by being deformed in a pin coupling direction to electrically connect to the pin 21. Here, the positions of the connector 20 and the connector coupling member 30 may be exchanged as necessary.

As illustrated in FIG. 2, the different signal lines 15a and 15b are mounted on the first board 11 and the second board 13, respectively, and can be connected to a board body mounted with various electronic components (not illustrated). The first board 11 and the second board 13 may be stacked in many folds as needed. The first board 11 may include various well-known boards to which components such as a cable can be electrically connected, as well as a printed circuit board.

The second board 13 includes a flexible printed circuit board. The flexible printed circuit board is made of polyimide having good flexibility.

Referring to FIGS. 2 and 3, the signal lines 15a and 15b are generally made of a material including thin copper and may intersect each other. The signal lines 15a and 15b are formed on the first and second boards 11 and 13 respectively, so that they correspond to conductors 37 of the connector coupling member 30 and the pins 21 of the connector 20, respectively.

Figure 4:
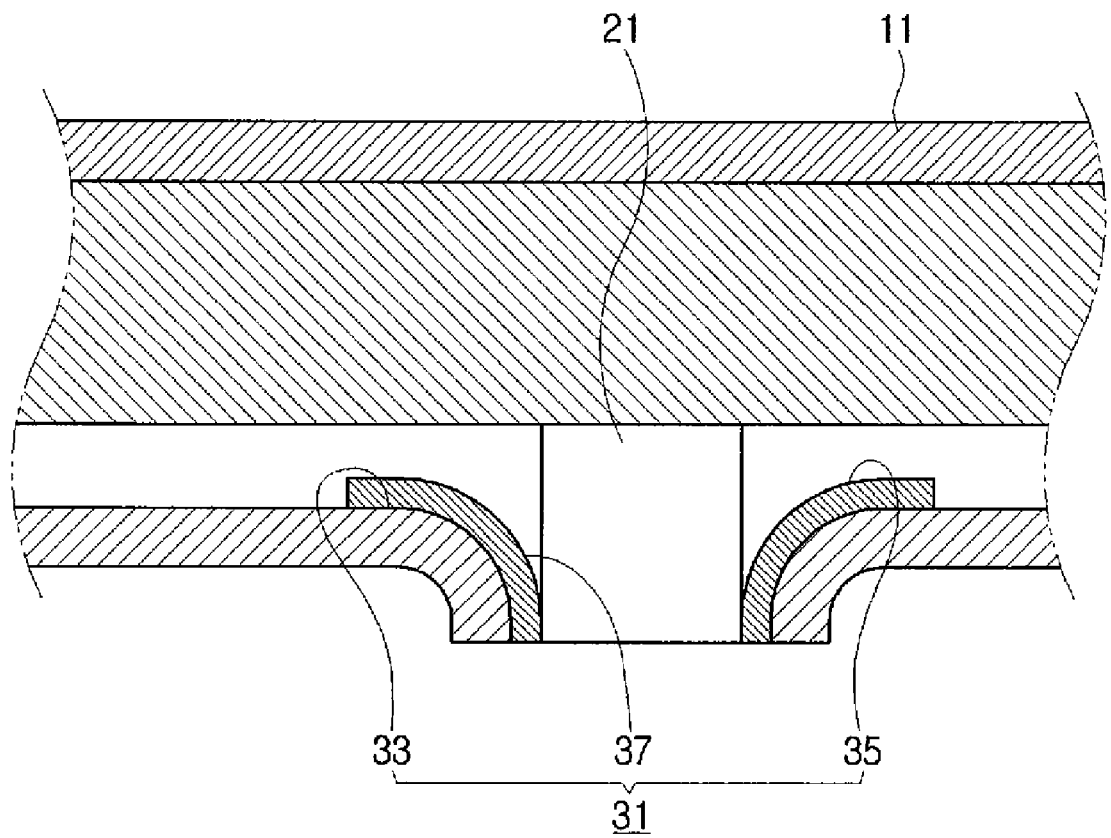
FIG. 4 is a schematic sectional view illustrating a coupling state of a pin and a pin coupling member according to the embodiment of FIG. 2.

Referring to FIGS. 2 through 4, the plurality of pins 21 of the connector 20 protrude from the surface of the connector 20 to correspond to the signal lines 15a of the first board 11 and to pin housings 31 of the second board 13. The connector 20 is coupled to the first board 11 by soldering, etc.

As described above, the pin housings 31 of the connector coupling member 30 come in electrical contact with the pins 21 by being deformed in the coupling direction of the pins 21.

Accordingly, the connector coupling member 30, which is electrically connected to the connector 20, is provided on the surface of the second board 13, to thereby accomplish a simple structure and convenient use, with a small number of components, so that its manufacturing process can be simplified and its manufacturing cost can be reduced. Furthermore, its required space can become small, and thus its thickness can be decreased.

As illustrated in FIG. 4, each pin housing 31 has a pin housing body 33 and a pin contact member 35 which is deformable to come in contact with the pin 21, disposed on the pin housing body 33 and extending from the signal line 15b. The pin housing 31 is formed in a circular shape to correspond to the shape of the pin 21, but it may have various shapes, such as an oval shape, as needed.

The pin housing body 33 is integrally provided in the second board 13. The pin contact member 35 is coupled to the surface of the pin housing body 33.

The pin contact member 35 has at least one conductive part 37 in an area which comes in contact with the pin 21. The conductive part 37 extends from an inner side of the pin contact member 35 and is deformable to receive the pin 21. The pin contact member 35 may be made of a member having a predetermined elastic force as needed. The inner side of the pin contact member 35 may also include a plurality of conductive parts 37 to be spaced from each other, and to be disposed radially about the inner side of the pin contact member 35. Accordingly, the pin 21 of the connector 20 comes into elastic contact with the pin contact member 35, thereby maintaining a stable coupling force with respect to the pin contact member 35 even in case of an external force.

The conductive part 37 may be made of a material including thin copper. An area of the conductive part 37, which comes in contact with the pin 21, is exposed to outside the printed circuit board assembly 10. The remaining area of the conductive part 37 is not exposed, but it may be exposed as needed.

A coupling process of the printed circuit board assembly 10 according to the present general inventive concept having such a configuration will be described with reference to FIG. 4.

The first board 11 and the second board 13 are disposed so that the pins 21 of the connector 20 correspond to the pin housings 31 of the connector coupling member 30. A user may press the pins 21 so that the pins 21 insert into the pin contact members 35, while the pin contact members 35 are deformed in the coupling direction of the pins 21. Accordingly, the conductive parts 37 of the pin contact members 35 come in electrical contact with the pins 21. The pins 21 may be separated from the pin contact members 35 by an external force to overcome an elastic force of the pin contact members 35.

Figure 5A:
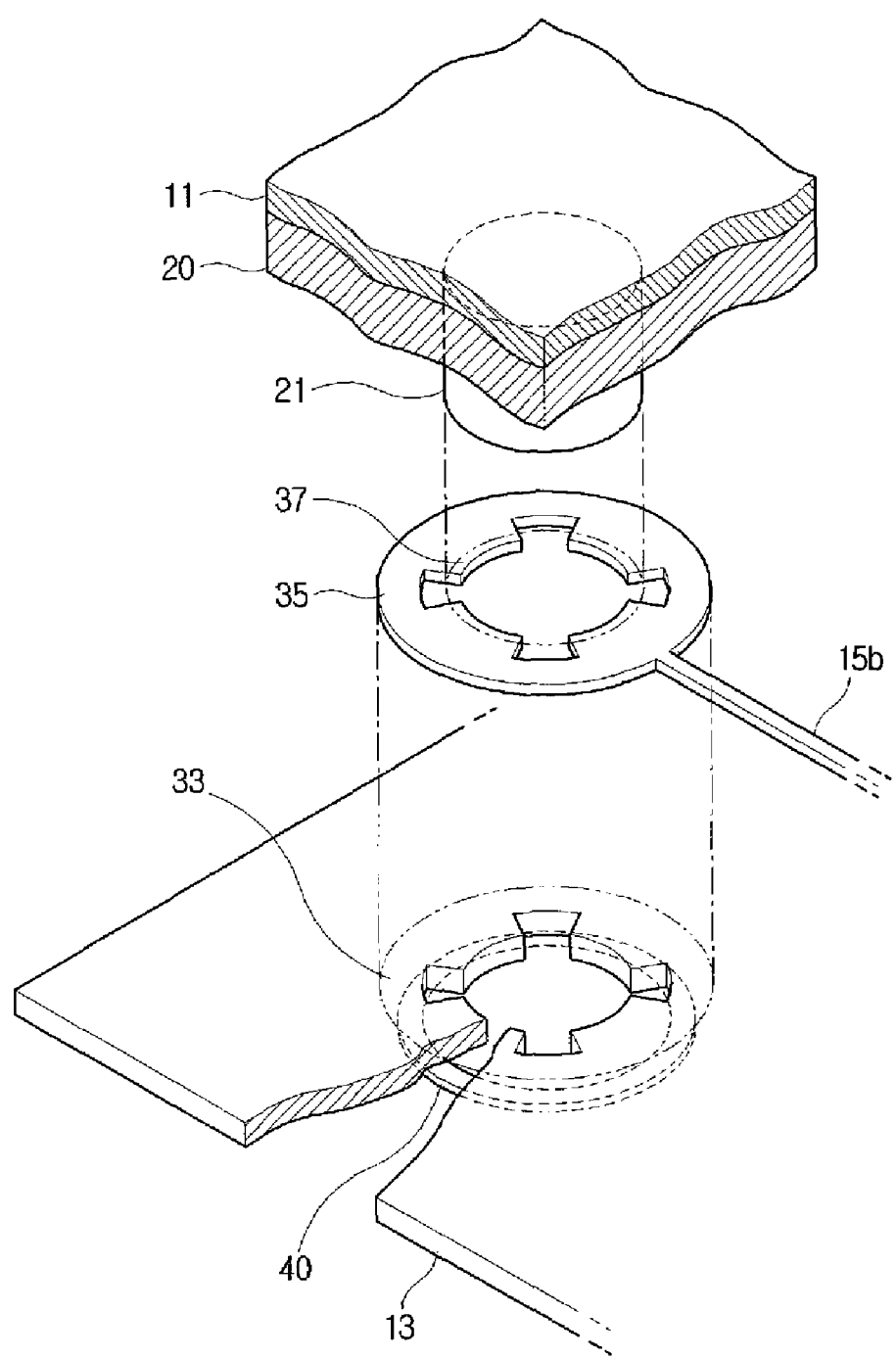
FIG. 5A is a partially enlarged plan view illustrating a connector pin according to another embodiment of the present general inventive concept.
Figure 5B:
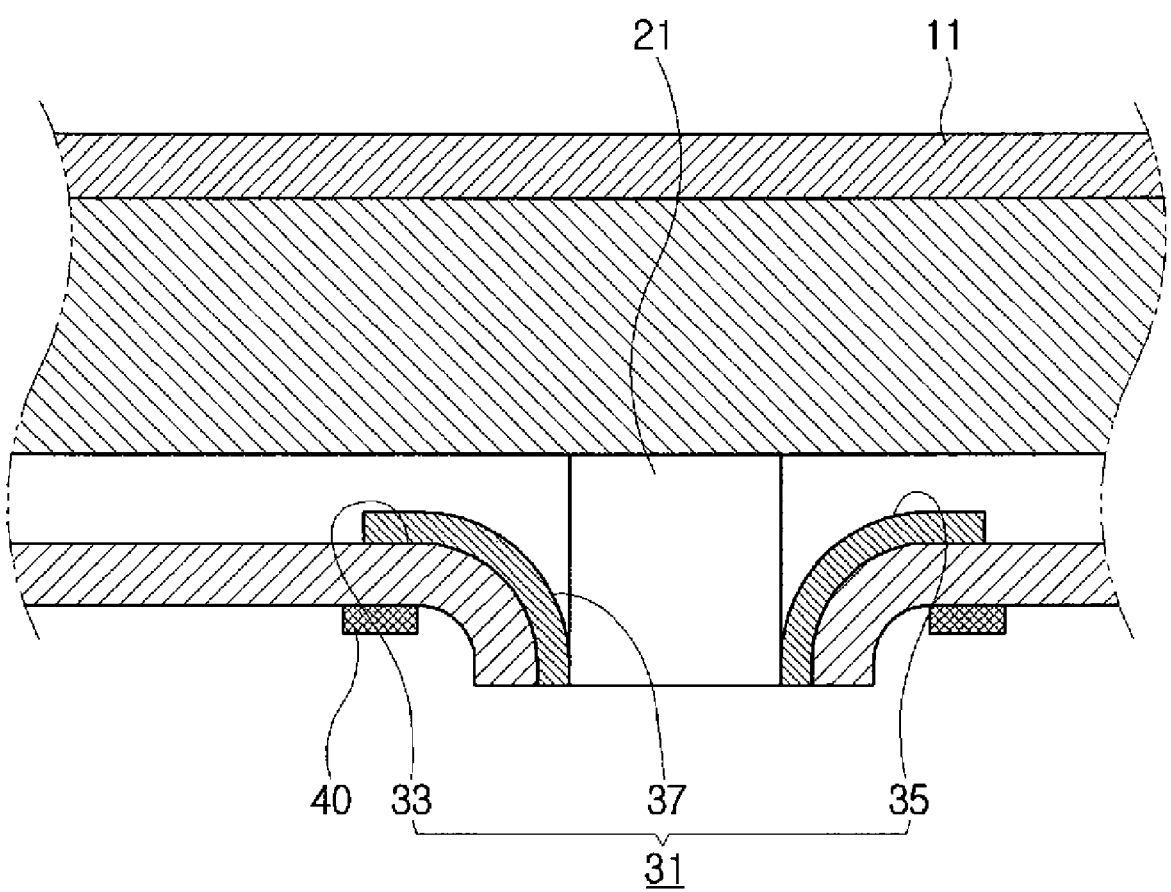
FIG. 5B is a schematic sectional view illustrating a coupling state of a pin and a pin coupling member according to the embodiment of FIG. 5A.

As illustrated in FIGS. 2 and 5A-5B, a printed circuit board assembly 10 according to another embodiment of the present general inventive concept includes a first board 11 and a second board 13 each having signal lines 15a and 15b, a connector 20 having a plurality of pins 21 provided in the first board 11, a connector coupling member 30 having pin housings 31 which come in contact with the pins 21 by being deformed in a pin coupling direction and provided in the second board 13 to electrically connect to the pins 21, and reinforcing plates 40 coupled to a surrounding area of the pin housings 31.

As compared with the embodiment of FIG. 3, the embodiment of FIG. 5A further includes the reinforcing plate 40.

The reinforcing plate 40 is made of a material such as plastics, to thereby reinforce the connector coupling member 30 which is coupled to the pin 21.

As described above, according to the present general inventive concept, it is possible to provide a printed circuit board assembly and an electronic apparatus having the same which is capable of accomplishing convenient use with a relatively simple structure, reducing a production cost by means of a small number of components and a simple manufacturing process, and decreasing its thickness by means of a small space.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A printed circuit board assembly in which signal lines are connected between a first board and a second board, comprising:
   a connector having a plurality of pins provided in one of the first board and the second board; and
   a connector coupling member having a plurality of pin housings which come in contact with the pins, wherein the pin housings comprise:
      a pin housing body integrally provided in the other of the first board and the second board to elastically deform in a pin coupling direction in response to an insertion of the pins therein; and
      a pin contact member provided on the pin housing body to electrically connect to the pins by deforming in the pin coupling direction together with the pin housing body in response to the insertion of the pins therein.

2. The printed circuit board assembly according to claim 1, wherein the pin contact member comprises:
   a conductive part provided to electrically connect to each signal line of the other of the first board and the second board.

3. The printed circuit board assembly according to claim 2, wherein an area of the conductive part, which comes in contact with the pin, is exposed to electrically connect to the outside.

4. The printed circuit board assembly according to claim 2, further comprising:
   a plurality of conductive parts provided in an inner side of the pin contact member to be spaced from each other, the plurality of conductive parts to be disposed radially.

5. The printed circuit board assembly according to claim 1, wherein the other of the first board and the second board, on which the connector coupling member is provided, comprises:
   a flexible printed circuit board (FPC).

6. The printed circuit board assembly according to claim 5, wherein the flexible printed circuit board comprises polyimide.

7. The printed circuit board assembly according to claim 1, further comprising:
   a reinforcing plate coupled to a surrounding area of each pin housing.

8. The printed circuit board assembly according to claim 7, wherein the reinforcing plate comprises plastics.

9. An electronic apparatus comprising a printed circuit board assembly in which signal lines are connected between a first board and a second board, the printed circuit board comprising:
   a connector having a plurality of pins provided in one of the first board and the second board; and
   a connector coupling member having a plurality of pin housings which come in contact with the pins, wherein the pin housings comprise:
      a pin housing body integrally provided in the other of the first board and the second board to elastically deform in a pin coupling direction in response to an insertion of the pins therein; and
      a pin contact member provided on the pin housing body to electrically connect to the pins by deforming in the pin coupling direction together with the pin housing body in response to the insertion of the pins therein.

10. The electronic apparatus according to claim 9, wherein each pin housing comprises:

a pin housing body; and a pin contact member provided on the pin housing body and being deformable to come in contact with the pin.

11. The electronic apparatus according to claim 9, wherein the pin contact member comprises:

a conductive part provided to electrically connect to each signal line of the other of the first board and the second board.

12. The electronic apparatus according to claim 11, wherein an area of the conductive part, which comes in contact with the pin, is exposed to electrically connect to the outside.

13. The electronic apparatus according to claim 11, further comprising:

a plurality of conductive parts provided in an inner side of the pin contact member to be spaced from each other, the plurality of conductive parts to be disposed radially.

14. The electronic apparatus according to claim 9, wherein the other of the first board and the second board, on which the connector coupling member is provided, comprises:

a flexible printed circuit board (FPC).

15. The electronic apparatus according to claim 14, wherein the flexible printed circuit board comprises polyimide.

16. The electronic apparatus according to claim 10, wherein the printed circuit board further comprises:

a reinforcing plate coupled to a surrounding area of each pin housing.

17. The electronic apparatus according to claim 16, wherein the reinforcing plate comprises plastics.

18. A printed circuit board assembly, comprising:

a pin coupled to a first signal line in a first board;

a pin housing coupled to a second signal line in a second board to elastically deform in a pin coupling direction in response to an insertion of the pin therein; and a conductive part coupled to the pin housing to elastically and electrically connect the pin to the pin housing, wherein the conductive part deforms in the pin coupling direction together with the pin housing to secure the pin thereto.

19. The printed circuit board assembly according to claim 18, wherein the conductive part is deformed in the pin coupling direction.

20. The printed circuit board assembly according to claim 18, wherein the pin housing deforms with the conductive part.

21. A printed circuit board assembly, comprising:

a connector having a plurality of pins provided in one of a first board and a second board; and a plurality of deformable receiving units provided on the other of the first board and the second board to securely receive a respective pin by deforming in a pin receiving direction, the plurality of deformable receiving units comprising:

a pin contact member to electrically connect to the respective pin by deforming in the pin receiving direction in response to an insertion of the respective pin therein, and a pin housing body to support the pin contact member and deform in the pin receiving direction together with the pin contact member in response to the insertion of the respective pin therein.

22. The printed circuit board assembly according to claim 21, wherein the pin housing body is integral to the other of the first board and the second board; and the pin contact member is coupled to a surface of the pin housing body.

* * * * *